(12) United States Patent
Sonsky et al.

(10) Patent No.: US 7,808,050 B2
(45) Date of Patent: Oct. 5, 2010

(54) SEMICONDUCTOR DEVICE WITH RELATIVELY HIGH BREAKDOWN VOLTAGE AND MANUFACTURING METHOD

(75) Inventors: Jan Sonsky, Leuven (BE); Anco Heringa, Waalre (NL)

(73) Assignee: NXP B.V., Eindhoven (NL)

( * ) Notice: Subject to any disclaimer, the term of this patent is extended or adjusted under 35 U.S.C. 154(b) by 35 days.

(21) Appl. No.: 11/917,608

(22) PCT Filed: Jun. 14, 2006

(86) PCT No.: PCT/IB2006/051913

§ 371 (c)(1),
(2), (4) Date: Oct. 24, 2008

(87) PCT Pub. No.: WO2006/136979

PCT Pub. Date: Dec. 28, 2006

(65) Prior Publication Data
US 2009/0072319 A1 Mar. 19, 2009

(30) Foreign Application Priority Data
Jun. 22, 2005 (EP) .................... 05105564

(51) Int. Cl.
H01L 21/76 (2006.01)
H01L 29/78 (2006.01)
(52) U.S. Cl. ............... 257/368; 257/379; 257/E29.255; 257/E21.373; 438/296
(58) Field of Classification Search .............. 257/368, 257/379, 336, E29.255, 557, E21.373; 438/296, 438/379, 666, 204, 316, 335, 400, 405, 236
See application file for complete search history.

(56) References Cited

U.S. PATENT DOCUMENTS

| 4,796,070 | A | 1/1989 | Black |
| 5,438,215 | A | 8/1995 | Tihanyi |
| 6,475,865 | B1 * | 11/2002 | Yang et al. ............. 438/270 |
| 2005/0035398 | A1 * | 2/2005 | Williams et al. .......... 257/329 |

FOREIGN PATENT DOCUMENTS

| EP | 519741 A2 | 12/1992 |
| WO | 03043089 A1 | 5/2003 |
| WO | 2004102670 A2 | 11/2004 |
| WO | WO2004/102670 | * 11/2004 |
| WO | WO2004/102672 | * 11/2004 |
| WO | WO2005117073 | * 12/2005 |

OTHER PUBLICATIONS

Sze, "Semiconductor devices, physics and technology", 2002, Wiley and Sons, pp. 172, 188).*

* cited by examiner

Primary Examiner—Thomas L Dickey
Assistant Examiner—Nikolay Yushin

(57) ABSTRACT

A semiconductor device includes at least one active component (18) having a p-n junction (26) on the semiconductor substrate in an active region (19) of the semiconductor substrate (4). A shallow trench isolation pattern is used to form a plurality of longitudinally extending shallow trenches (12) containing insulator (14). These trenches define a plurality of longitudinal active stripes (10) between the shallow trenches (12). The shallow trench isolation depth ($ds\pi$) is greater than the junction depth (dsO of the longitudinal active stripes and the width (wsO of the active stripes (10) is less than the depletion length (ldepi) of the p-n junction.

18 Claims, 7 Drawing Sheets

SEMICONDUCTOR DEVICE WITH RELATIVELY HIGH BREAKDOWN VOLTAGE AND MANUFACTURING METHOD

The invention relates to a method of manufacturing a semiconductor device, a semiconductor device and an integrated circuit including the semiconductor device, and particularly to a method of manufacturing a semiconductor device with an improved breakdown voltage and the device.

In semiconductor devices including p-n junctions, including for example simple diodes as well as more complex devices such as field effect transistors, bipolar transistors or thyristors, high doping levels reduce the series resistance. However, on the other hand, low doping levels allow high reverse voltages to be applied. There is a trade-off between these quantities, and the maximum achievable trade off for a simple diode is known as the 1D silicon limit.

A number of structures are known that can deliver better results than the 1D limit. Such structures are typically known as reduced surface field (RESURF) structures. Junction shaping, or field shaping using field plates or semi-insulating films can be used.

An alternative approach bridges the junction using a dielectric layers—EP 519 741 A2 is an example of this technique.

However, these approaches all significantly add to the complexity of the manufacturing process and in particular they are not generally compatible with standard processes since they require additional mask and processing steps not present in the standard processes. There is a significant cost in adding such additional process steps.

Accordingly, there is a need for alternative ways of providing high breakdown voltages.

According to the invention there is provided a method of manufacturing a semiconductor device according to claim 1.

The trenches are filled with insulator, i.e. the trenches contain no conducting or resistive field plates or electrodes as in more conventional RESURF type devices. The use of insulator makes manufacture easier.

By using insulation filled trenches, the trench isolation steps in conventional processes generally used to define the active region of a device by providing a shallow trench isolation around the whole of the region can preferably be used to form the shallow trenches and hence to define the active stripes between the shallow trenches.

One problem with the use of the shallow trenches is that they are, as the name suggests, shallow, and typically less deep than conventional implantation steps used to form an n-well. Thus, if all that were done were to use the shallow trench isolation, the active stripes would typically be connected to each other under the trench isolation thereby significantly harming the RESURF effect.

The inventors have realized that this can be dealt with by forming the active stripes to have a p-n junction with a shallow junction depth less deep than the shallow trench.

The invention may be used in particular to form an insulated gate transistor. In this case, forming an active component includes:

forming a drain region and a source region of first conductivity type;

forming a channel region of second conductivity type opposite to the first conductivity type between the drain region and the source region; and forming an insulated gate over the channel region.

Alternatively, the invention can be used for forming a diode. Thus, in embodiments, the step of forming an active component includes:

forming a p-type region and an n-type region with a p-n junction between them; and forming contacts to the p-type and n-type regions.

The longitudinal active stripes may be formed by implanting using a shallow doping step to implant dopants to a dopant depth of less than the shallow trench isolation depth to define the depth of the longitudinal active stripes.

The shallow stripes may be tapered, which can have a similar effect to graded doping hence improving still further the breakdown voltage.

The shallow trenches may be filled with an insulator with a dielectric constant of at least 4; this increases the RESURF effect beyond that achievable with silicon dioxide (dielectric constant 3.9).

The shallow trenches can be whatever depth is used for the shallow trench isolation trenches in the process used. For example, the depth may be in the range 100 nm to 2 µm, for example 200 nm to 600 nm.

In another aspect the invention relates to a semiconductor device according to claim 8.

The device may have an active region within a shallow trench isolation region, the depth and filling of the shallow trench isolation region around the active region being the same as the depth and filling of the longitudinally extending trenches defining the active stripes. This aids manufacture, since they can be made in the same steps as mentioned above.

The active component may be, for example, a diode, an insulated gate field effect transistor, or another type of component.

The active stripes may be tapered.

The trenches are filled with an insulator, in embodiments with a dielectric constant of at least 4.

It is readily possible to integrate devices according to the invention into an integrated circuit. Accordingly, the invention also includes an integrated circuit including a semiconductor device as set out above.

For a better understanding of the invention, embodiments will now be described, purely by way of example, with reference to the accompanying drawings, in which.

The drawings are not to scale. Like components are given like reference numerals in the different Figures.

Figure 1:
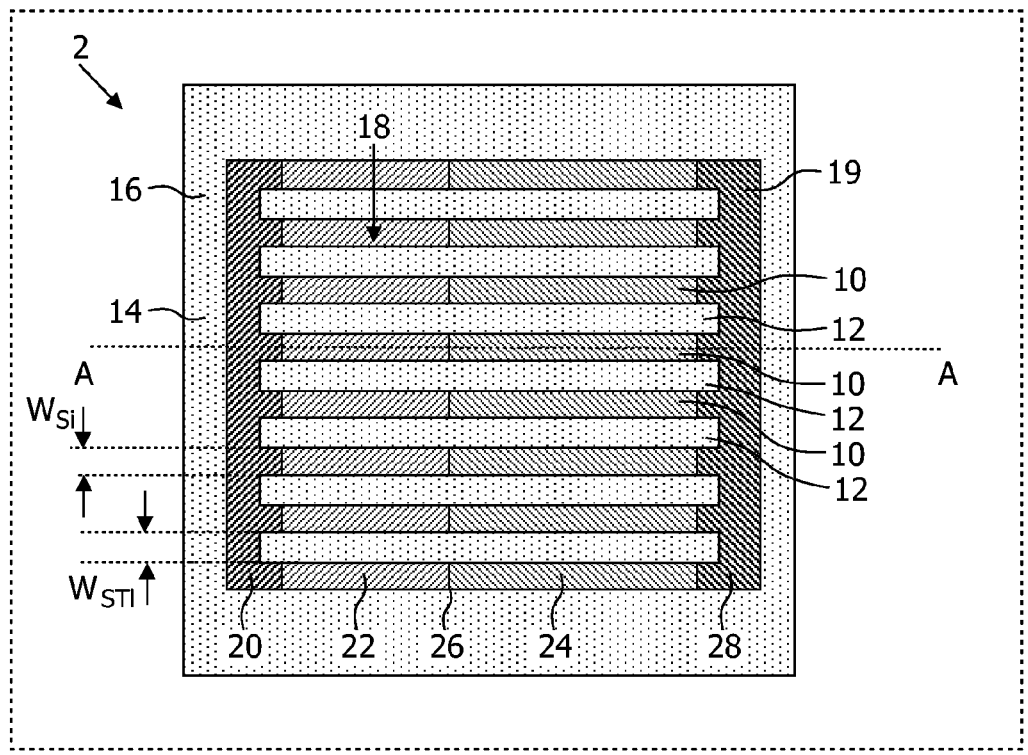
FIG. 1 shows a top view of a first embodiment of a semiconductor device according to the invention.
Figure 2:
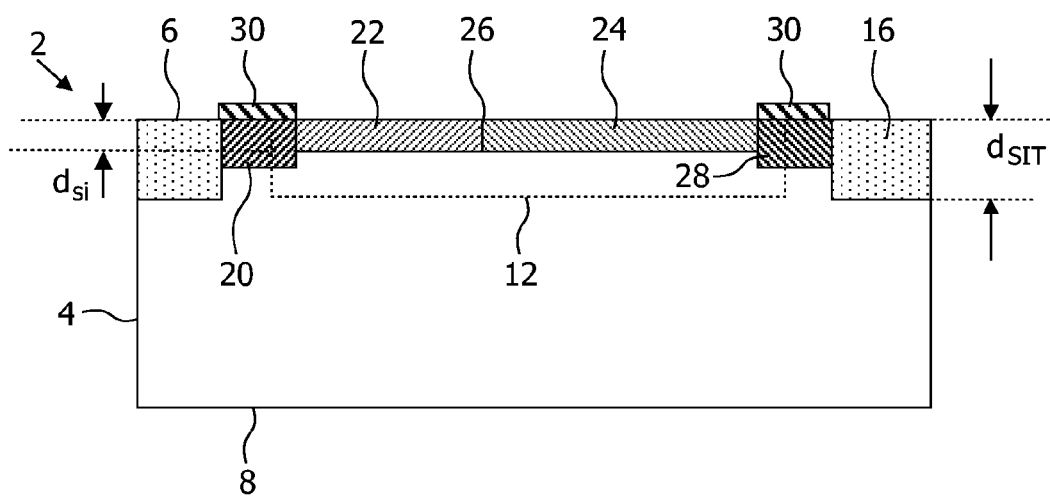
FIG. 2 shows a side section of the semiconductor device of FIG. 1.

Referring to FIGS. 1 and 2, a first embodiment of the invention is a p-n junction diode 2 semiconductor device seen in top view in FIG. 1 and along line A-A in FIG. 2.

The diode structure 18 is formed on substrate 4 which has a first (upper) major surface 6 and an opposed second major surface 8. The substrate is lightly doped p-type (p−).

The diode includes a plurality of longitudinally extending active stripes 10 separated by longitudinally extending insulated trenches 12 filled with oxide 14. The trenches have a trench (STI) depth $d_{STI}$ which in the embodiment is in the range 100 to 500 nm, and a trench width $w_{STI}$ which may be in the range 0.01 µm to 1 µm, for example. It will be appreciated that alternative embodiments using other standard manufacturing processes may have different widths and depths.

The active region 19 of the semiconductor device is surrounded and delimited by an isolation trench 16 which has the same depth and filling as the longitudinally extending trenches 12, enabling it to be formed in the same process steps.

Each active stripe 10 includes a highly doped p+ type contact region 20, a p-type region 22 extending longitudinally from the contact region 20, an n-type region 24 extending longitudinally from the p-type region and hence defining a p-n junction 26 at the interface between the p-type and n-type regions 22,24, and a n+ type contact region 28. Contacts 30 are provided on the first major surface 6 in contact with the p+ and n+ type contact regions 20, 28.

The width of the active stripe is $w_{Si}$ and the junction depth $d_{Si}$. Typical widths might be from 0.01 µm to 1 µm. In preferred embodiments, the widths are in the range 100 nm to 500 nm.

The doping levels in the longitudinally extending p-type and n-type regions may typically be in the range $10^{16}$ to $10^{18}$ cm$^{-3}$, and are not necessarily the same, though they can be. Higher doping levels can be used for the contact regions 20, 28.

The p-type region 22 can be deeper that the STI depth, since in this embodiment the depth of the n-type region 24 is less than the STI depth, so the junction depth of the p-n junction 26 between the p-type and n-type regions 22,24 is also less than the STI depth.

Figure 3:
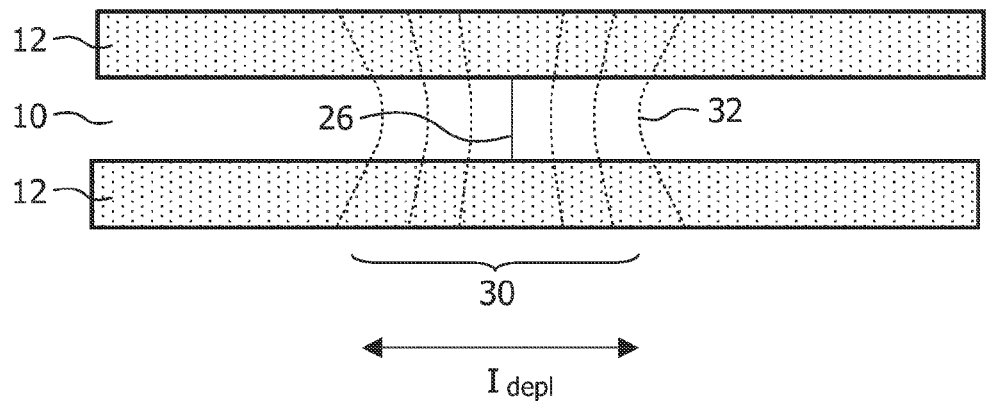
FIG. 3 shows the p-n junction in a single stripe of the device of FIG. 1.

As illustrated in FIG. 3 which shows a single stripe 10, there is a depletion region 30 along the stripe at the p-n junction. FIG. 3 also shows equipotential lines 32 with the p-n junction reversed biased with 30V.

The length $l_{depl}$ of this depletion region is affected by the "Dielectric RESURF" (Dielectric Reduced Surface Field) effect observed for sufficiently narrow active stripe width. The Dielectric RESURF effect increases the length of the depletion region compared to a wide p-n junction with the same doping levels. When a voltage is applied between the p-type and the n-type regions 22, 24, in a wide p-n junction the only charge needed to be provided is to charge up the effective capacitor across the depletion region in the semiconductor device. The depletion region provides this charge.

In a narrow stripe surrounded by dielectric, there is effectively an additional capacitance through the dielectric which also needs to be charged to maintain a field in the dielectric to maintain a voltage between p and n-type regions 22,24. The charge for this additional capacitance also must come from the depletion region which accordingly is longer in the narrow stripe.

Consequently, for any given reverse bias, the longer depletion length results in a reduced electric field across the depletion region. Thus, the breakdown voltage of the device with narrow stripes is enhanced over that of a wider device. The diodes will be referred to as DIELER diodes because of the Dielectric RESURF effect that they display.

Figure 4:
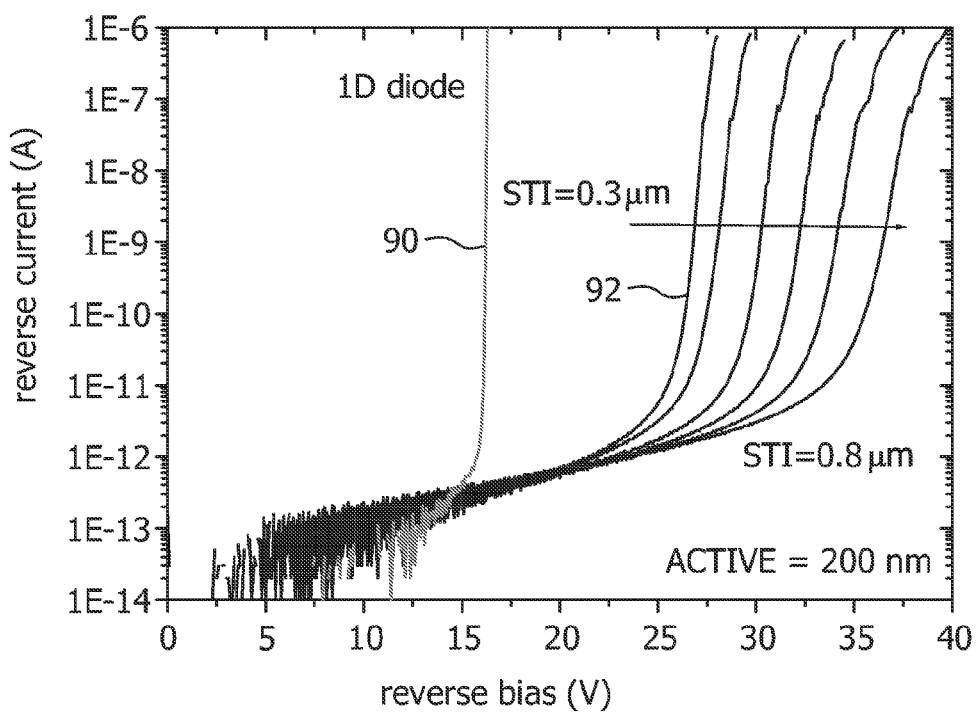
FIGS. 4 to 6 show breakdown voltages as a function of trench width for devices according to FIG. 1.
Figure 5:
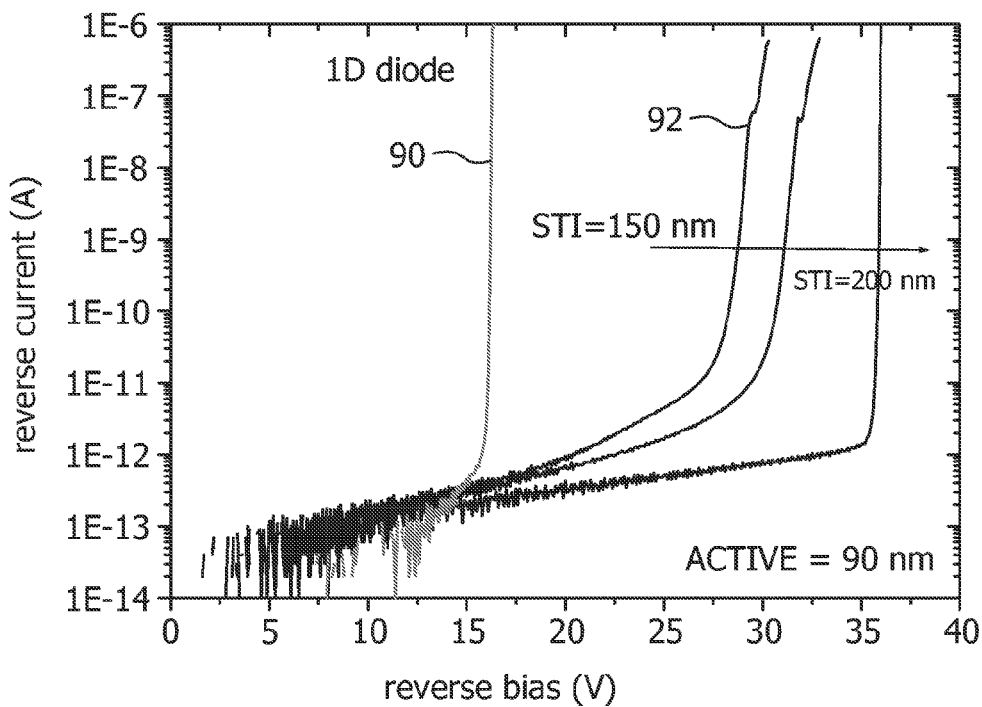
Figure 6:
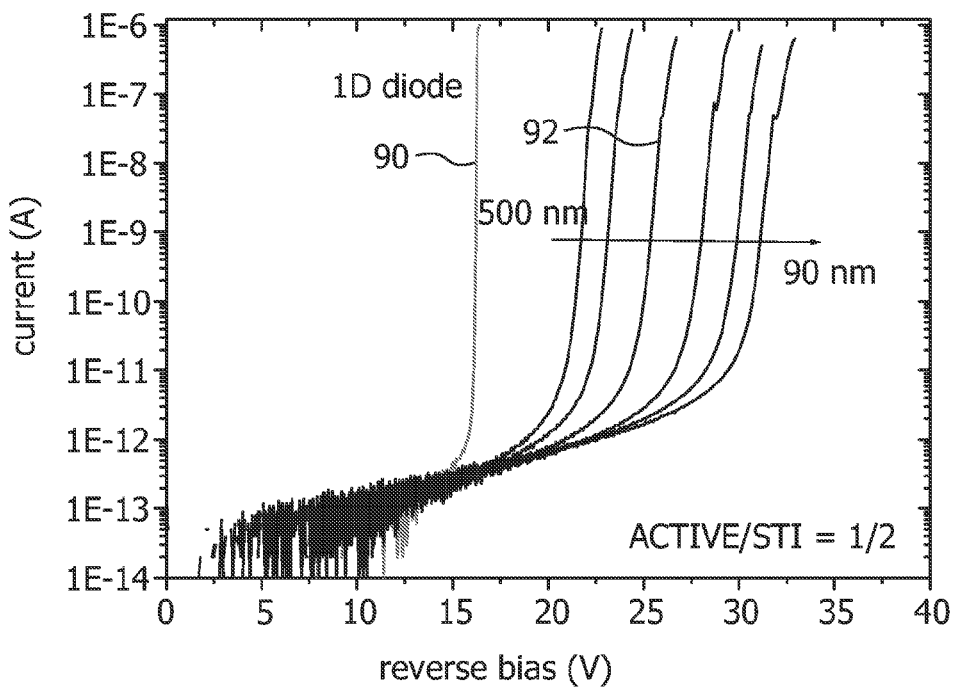

Experiments were carried out on diodes manufactured in accordance with FIGS. 1 and 2, and results are presented in FIGS. 4 to 6.

The doping in the drift region 42 is $2-3\times10^{17}$ cm$^{-3}$ in the devices tested except where specifically stated to be otherwise. A gate oxide thickness of 6.1 nm was used.

The width of the STI trenches 12 and the active stripes 10 in the drift region was varied.

FIG. 4 shows the reverse current as a function of reverse bias for a standard diode ("1D") without the STI trenches as curve 90. FIG. 4 also shows the reverse current as a function of reverse bias for a number of widths of trenches 12 varying from 0.3 µm to 0.8 µm as curves 92. In the experiment of FIG. 4, the active stripes 10 have a width of 200 nm.

FIG. 5 shows a similar experiment except that the active stripes 10 have a width of 90 nm, and the width of the trenches 12 was varied between 150 nm and 200 nm.

FIG. 6 shows the same curves but with a constant ratio (1:2) between the active stripes 10 and trenches 12, for a variety of different active stripe widths.

As will be seen, as the width of the active stripes increases the enhancement in breakdown voltage reduces. In particular, as the width increases to be comparable to the depletion length $l_{depl}$, the effect reduces—for a width much greater than the depletion length, the effect is minimal.

A benefit of the first embodiment is that the manufacture of the device can be achieved in a conventional process, as will now be explained. The process chosen is the standard Crolles2 Alliance 90 nm process, though other standard processes will also work.

Figure 7:
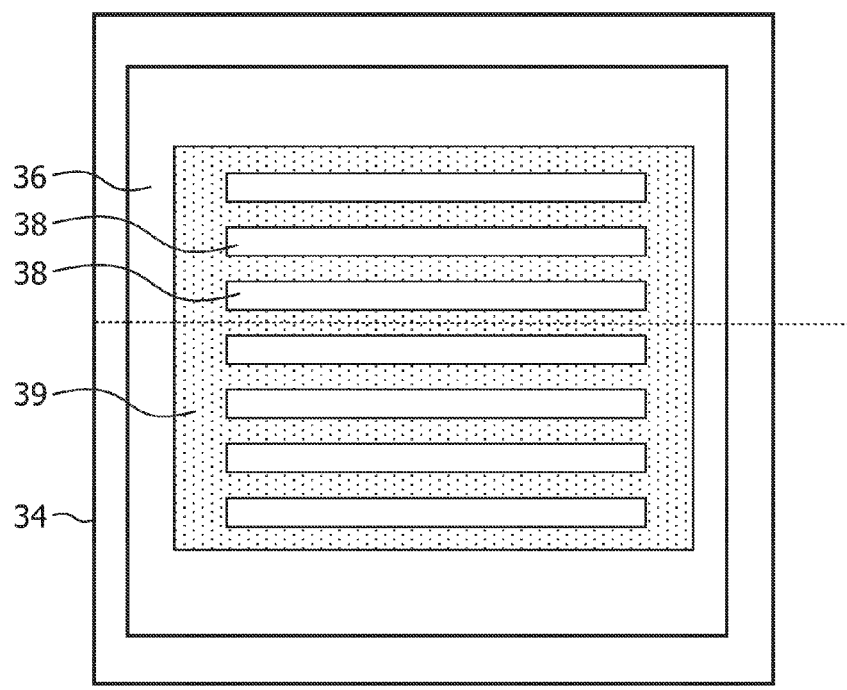
FIG. 7 shows a mask layout used in the manufacture of the device of FIG. 1.

To form the trenches 12, a shallow trench isolation (STI) mask 34 (FIG. 7) is used to provide a pattern. Solid region 39 of the mask defines an active region 19 of the finished device. The solid region 39 is surrounded by pattern elements 36 which are openings that define the location of the shallow trench 16 around the active region 19. Pattern elements 38 are openings that define the locations of the trenches 12 between the active stripes 10 in the finished device.

The trenches are then etched and filled with oxide to form the structure of FIGS. 1 and 2. Thus, the single STI patterning step which is standard in the process can be used to form both a shallow trench isolation 16 around the active region 19 and also the longitudinally extending trenches 12.

After forming the trenches, processing continues using the standard process to complete the device.

Normally, the STI isolation step could not be used within a device to delimit active regions, since as the name suggests the STI step forms a shallow trench, perhaps 400 nm deep, which is less deep than most conventional implants used to form wells of active devices. However, by using the shallow threshold adjustment implant of the standard process for a very different purpose, to form the n-type region 24, the p-n junction depth only extends to the depth of this region so that shallow trenches 12 are sufficiently deep to successfully isolate the p-n junctions 26 from one another.

The p-type region 22 is manufactured using the standard mask and implant step normally used to implant the p-well. The n-type region 24 cannot be manufactured using a normal n-well process, since the depth of that process is too deep. Accordingly, the n-type region 24 is manufactured using the processing steps normally used to adjust the voltage threshold of p-type field effect transistors which implants n-type dopant to a depth of about 200 nm.

Contact regions 20, 28 are implanted using the standard steps used to implant contact regions.

This leads to the structure shown in FIGS. 1 and 2.

Note that the order of the steps is not critical for the invention.

Thus, the invention allows the production of a diode with enhanced voltage breakdown using nothing more than standard process steps.

The invention is not just useful for diodes, but for many other device types. For example, in a second embodiment of the invention, the active component 18 is an n-MOS type transistor with an extended drain as illustrated in FIG. 8.

The transistor includes a p-type channel region 40, an n-type drift region 42 which is normally thought of as part of an extended drain 42,44, one or more n+ type drain contact region 44, and a plurality of n+ type source contacts 46 in the channel region 40. Instead of this arrangement, the source contact can be also one long stripe similar to the drain contact region 44 or otherwise shaped. An insulated gate 50 is provided over the channel region 40. A p+ contact region 49 is also provided to provide a body contact to the channel region 40.

The drift region 42 has a plurality of longitudinal stripes 48 which are divided by shallow trench isolation structures 52. Note that in the transistor of FIG. 8, the shallow trench isolation structures 52 extend the length of the drift region 42 but do not extend throughout the whole of the channel region 40. This allows a significant reduction of the channel resistance because of the large channel width. Further, by not having the shallow trench isolation structures extend through the channel region, narrow channel effects such as threshold voltage shift can be minimized.

Figure 8:
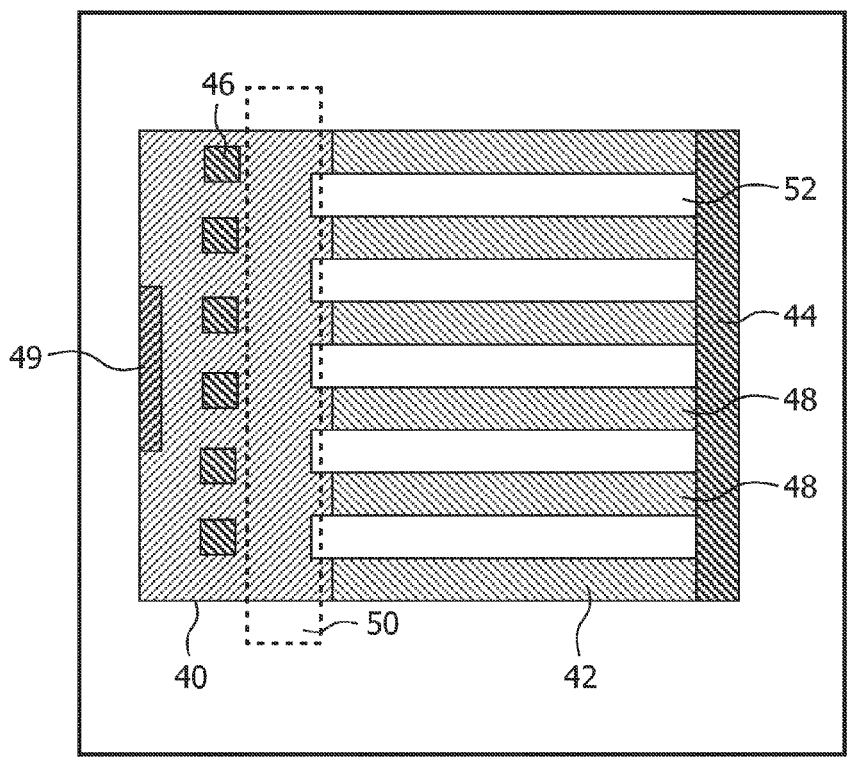
FIG. 8 shows a top view of a second embodiment of a semiconductor device according to the invention.

The structure of FIG. 8 is similar to that of FIGS. 1 and 2, except for the provision of the insulated gate, the shorter length of the isolation structures 52, and the use of an n+ type source contact instead of the p+ type contact of FIGS. 1 and 2.

Similarly to the embodiment of FIGS. 1 and 2, the n-type drift region 42 is formed using the shallow implantation step normally used in the standard process to adjust the threshold voltage of the transistor by implantation under the gate. This provides a shallow drift region, of depth in the process used of about 200 nm, less than the depth of the shallow trenches 52 of about 400 nm.

The structure of FIG. 8 can accordingly be manufactured in the same way as that of FIGS. 1 and 2, using the same standard process with an appropriate layout of standard masks. The process does add the steps forming the insulated gate 50, but these are, of course, present in the standard process.

Thus, the arrangement of FIG. 8 represents an enhanced breakdown transistor that can be manufactured readily using standard processes.

Figure 9:
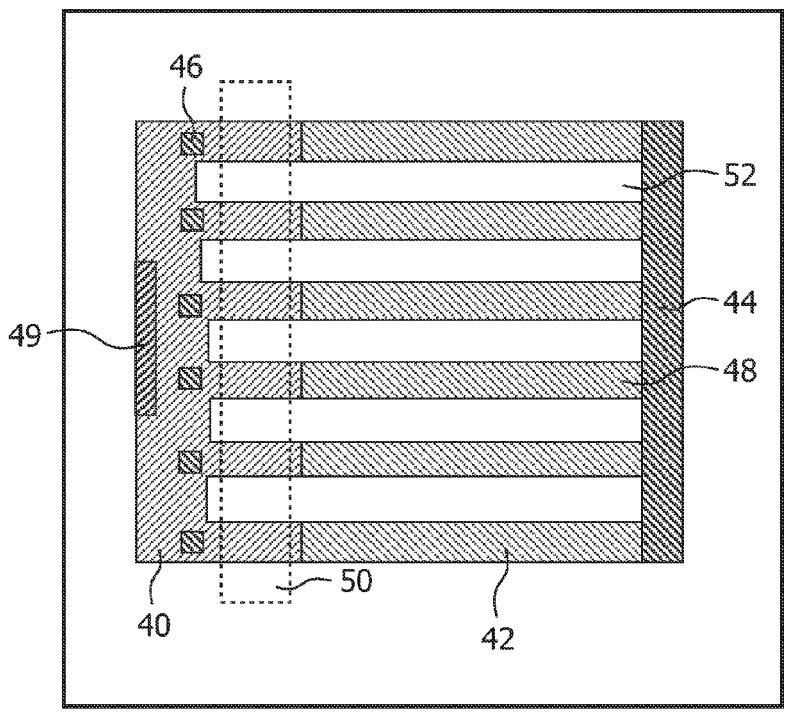
FIG. 9 shows a top view of a third embodiment of a semiconductor device according to the invention.

An alternative embodiment is illustrated in FIG. 9 which is the same as the embodiment of FIG. 8 except that the isolation structures 52 extend fully under the gate 50 as well as the length of the drift region 42. Note that in alternative embodiments, the isolation structures 52 may extend the complete length of the active region 19 of the device.

Figure 10:
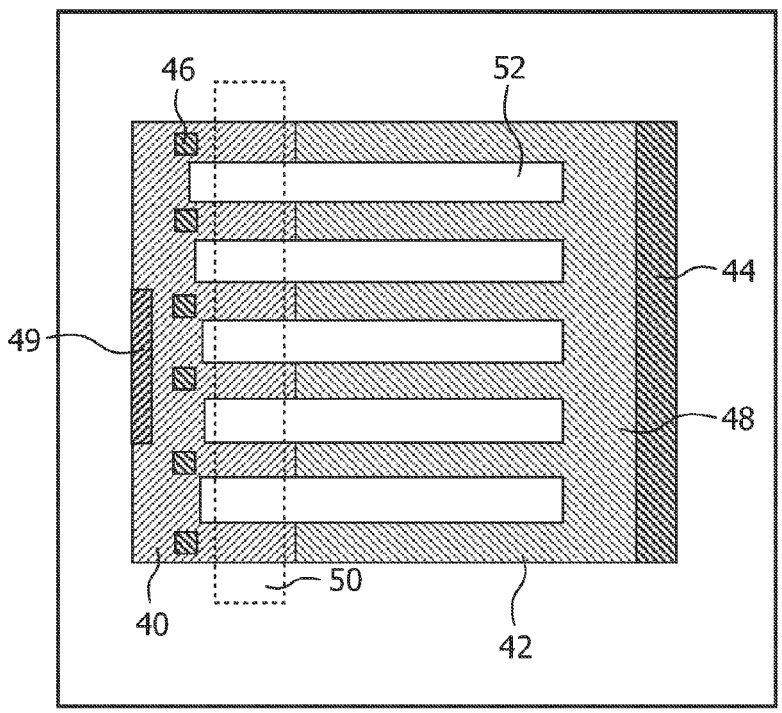
FIG. 10 shows a top view of a fourth embodiment of a semiconductor device according to the invention.

FIG. 10 shows a further alternative embodiment in which the STI regions extend only partially into the drift region.

An improvement in the breakdown voltage may be obtained in these devices which mirrors the improvement obtained in the diodes.

Figure 11:
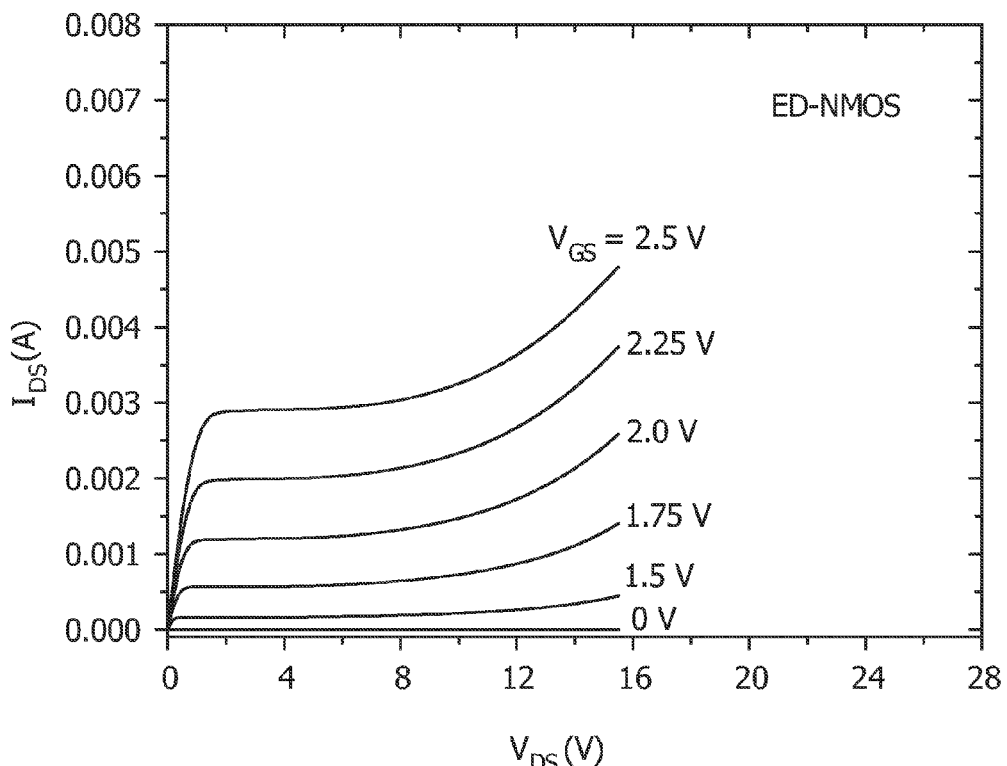
FIGS. 11 to 12 are experimental results obtained using devices according to FIG. 8 with various trench widths and active region widths.
Figure 12:
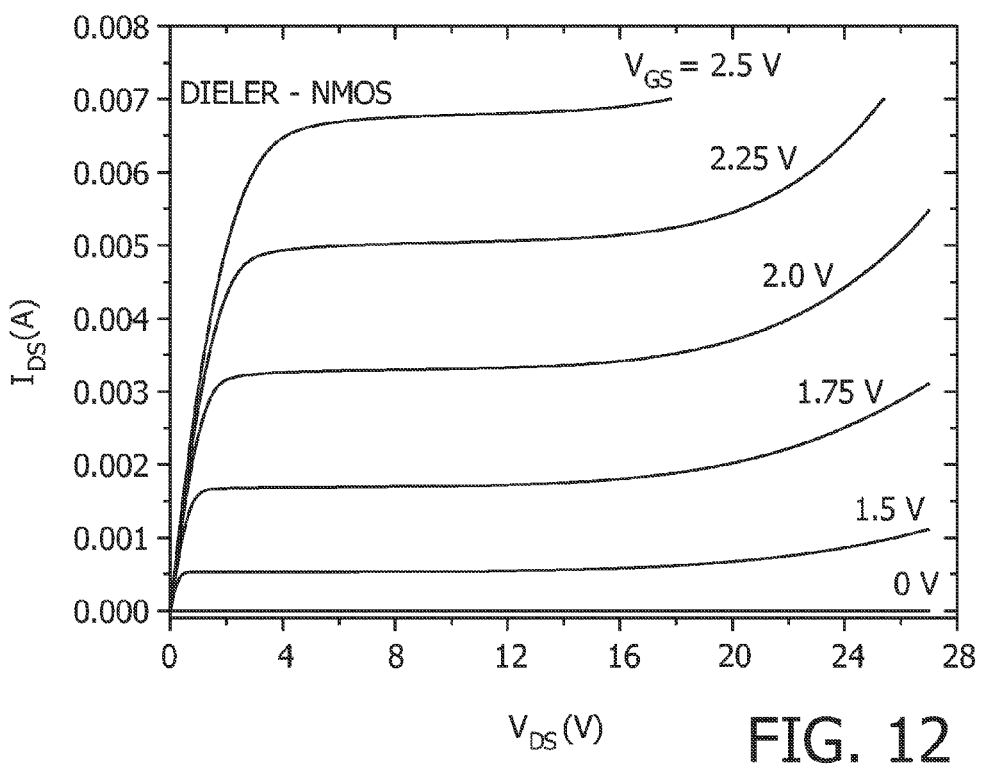

The transistor of the invention also gives good results in the on-state. FIG. 11 shows measured current-drain source voltage relationships for a conventional transistor without the trenches 52, and FIG. 12 shows the same relationship for a transistor according to the invention. Note that the transistor according to the invention (FIG. 12) is fully functional at double the drain voltage of the prior art transistor of FIG. 11.

Figure 13:
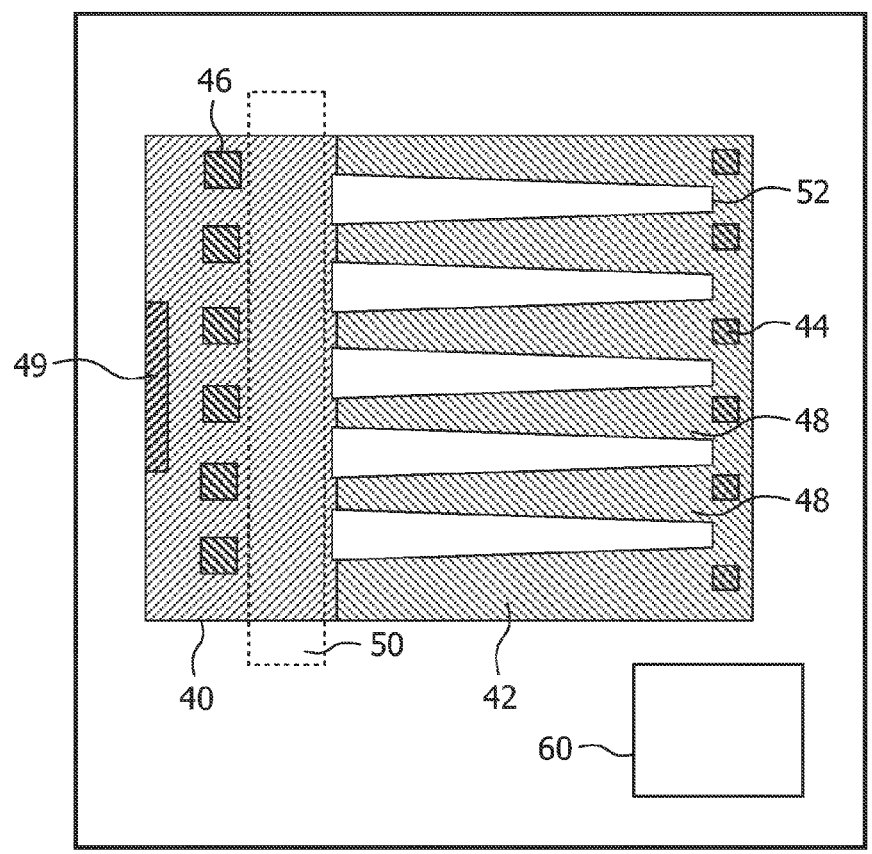
FIG. 13 is a top view of a fifth embodiment of a semiconductor device according to the invention.

FIG. 13 illustrates an alternative transistor arrangement with tapering shallow trenches 52 and accordingly tapering stripes 48. The stripes 48 are arranged to be narrow at the end under the gate 50 and wider at the drain 44. This effectively amounts to graded doping across the extended drain region which further improves the trade-off between breakdown voltage and on-resistance.

In this arrangement with tapered trenches, as in the previous embodiments, the trenches 52 may extend through the p-body region 40 completely or only partially. The width of the trenches in the body region will be preferably kept constant (not tapered) and preferably equal to the width at the p-n junction 26. Furthermore, the tapered trenches 52 may also extend only partially into the drift region 42.

Although the embodiments above have been described with reference to single transistors and diodes, the ability of the transistors and diodes to be manufactured using standard processes makes it extremely easy to include such enhanced standard transistors in integrated circuits. This ability to integrate the transistors and diodes into such an integrated circuit is a major advantage of the embodiments.

The invention can thus provide transistors with improved breakdown voltages above those available in core IC libraries. These may be needed for input/output functionality, analogue functionality or power management/amplification.

Thus, the invention also relates to integrated circuits including the enhanced devices described above, as well as additional components indicated highly schematically and not to scale with reference numeral 60 (FIG. 13). Such additional components can of course be included with any device, not just the transistor of FIG. 13.

Figure 14:
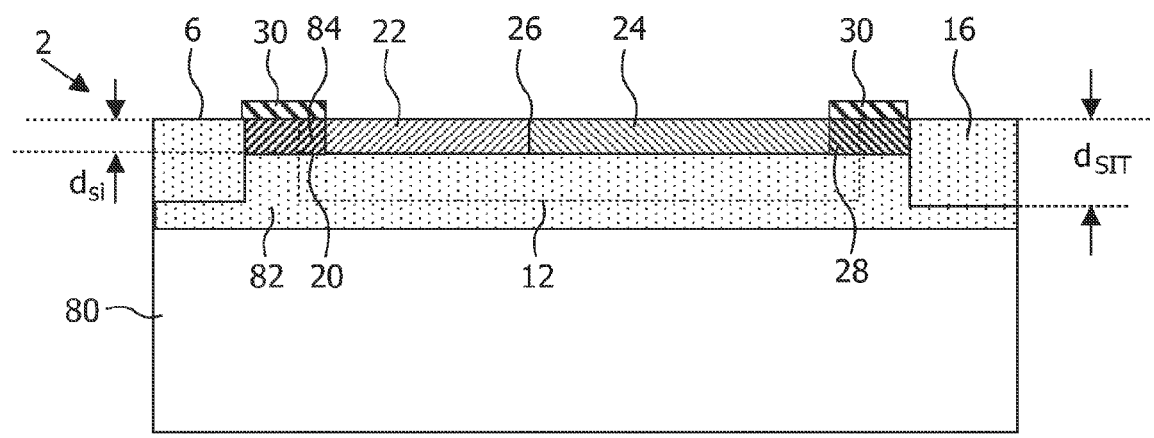
FIG. 14 is a side view of a sixth embodiment of a semiconductor device according to the invention.

In a development of these embodiments, the semiconductor body used is not a conventional semiconductor substrate but instead a semiconductor on insulator substrate. In a first variation, a semiconductor body is formed on the insulating wafer, for example on an oxide layer on the wafer, and the shallow trenches are formed through the whole thickness of the semiconductor body, i.e. the semiconductor body is thin. An example is illustrated in FIG. 14, which shows the insulated substrate 80, covered in oxide layer 82, and the thin semiconductor body 84. Also shown are the trenches 16,12, which extend through the thin semiconductor body 84 into the oxide layer 82. Any of the various patterns on the first major surface illustrated in FIGS. 8 to 10 and 13 can be used in this arrangement. Any suitable insulated substrate can be used, for example silicon insulated by oxide, sapphire etc.

Alternatively, the semiconductor body above the insulated substrate can be thicker than the depth of the trenches, in which case a similar structure can be used as above.

The invention allows new circuit applications to be manufactured using a standard process that would have previously needed substantial process modifications. Such applications include dc-dc converters, power management units and display drivers.

Further, those skilled in the art will appreciate that many modifications to the processes described in the specific embodiment are possible.

For example, it is not necessary to fill the shallow trenches with oxide, or oxide alone, and other materials such as silicon nitride, or low doped (preferably undoped) polysilicon may be used.

Such materials have a higher dielectric constant k than silicon dioxide (k 3.9 for silicon dioxide, 7.5 for silicon nitride, and 11.7 for low doped polysilicon). Accordingly, in a preferred arrangement, the oxide filling some of the trenches of the embodiments above is replaced by a material having a dielectric constant of at least 4, preferably at least 7. In such case, only the longitudinally extending trenches 12, 14, 52 within the active region 19 of the device according to the this invention are filled with the dielectric material having a higher dielectric constant, while the other (outside this device) shallow trenches are filled with the standard insulator. In a particular arrangement, the trenches 52 adjacent to the drift region 42 can be filled with the high dielectric material and the remaining parts of these trenches 52 in the channel region 40 and the trenches 16 around the device are filled with lower dielectric material such as silicon dioxide.

The substrate used need not be silicon and alternatives such as gallium arsenide, indium phosphide, and many others may also be used.

Further, although the embodiments of FIGS. 8, 9,10 and 13 use a p-type channel region and n-type source and drain, it will be appreciated that the invention is just as applicable to a transistor using an n-type channel, and/or p-type sources and drains. Nor is the invention just restricted to diodes and insulated gate field effect transistors, but may be applied to any device, for example gated bipolar transistors, etc.

The semiconductor body can be a single crystal, a single crystal with an epilayer formed on top, or other technologies such as silicon on insulator, silicon on sapphire etc may also be used.

It will be noted that the length of the trenches is not the same in the embodiments described, in some case the trenches only extend through the drift region, in some they span the p-n junction.

Although the description and claims use the term "pn junction", this is intended to include "p-i-n junctions" in which p-type material is separated from n-type material by intrinsic material. In such cases, the p-n junction and its depth are as defined by the whole p-i-n structure.

The invention claimed is:

1. A lateral semiconductor device, comprising:
   a semiconductor body with opposed first and second major surfaces;
   an active region on the first major surface; and
   at least one active component in the active region wherein the active component includes a plurality of longitudinal active stripes separated from one another by longitudinally extending trenches filled with an insulator, the trenches having a trench depth;
   wherein the longitudinal active stripes have a horizontal p-n junction with a junction depth less than the trench depth; and
   the width of the longitudinal active stripes is less than the depletion length of the horizontal p-n junction in the stripes.

2. A semiconductor device according to claim 1 further comprising a shallow trench isolation region around the active region, the shallow trench isolation region being a trench having the same trench depth as the longitudinally extending trenches and the same filling.

3. A semiconductor device according to claim 1 wherein the junction depth of the p-n junction is defined by the depth of the implant of either the p-type region, the n-type region or both the p-type and the n-type regions adjacent to the p-n junction.

4. A semiconductor device according to claim 1 wherein the active component is a transistor including:
   a drain contact region doped to be a first conductivity type;
   a source contact region doped to be the first conductivity type;
   a channel region adjacent the source contact region, the channel region being doped to be of a second conductivity type opposite to the first conductivity type;
   a drift region doped to be the first conductivity type extending longitudinally between the channel region and the drain contact region defining the p-n junction between the drift region and the channel region; and
   an insulated gate extending over the channel region between the source contact region and the drift region;
   wherein the plurality of longitudinal active stripes extend across the p-n junction.

5. A semiconductor device according to claim 4 wherein the longitudinally extending trenches extend only partially into the channel region.

6. A semiconductor device according to claim 1 wherein the active component is a diode having a p-type region and an n-type region with a p-n junction between them and contacts to the p-type and n-type regions.

7. A semiconductor device according to claim 1 wherein the active stripes are tapered.

8. A semiconductor device according to claim 7 wherein the longitudinal active stripes extend from the p-n junction and the longitudinal active stripes are tapered to have a narrower lateral extent at the end adjacent to the p-n junction than at the other end.

9. A semiconductor device according to claim 1 where the shallow trenches are filled with an insulator with a dielectric constant of at least 4.

10. A semiconductor device according to claim 1 wherein the device is a semiconductor on insulator device including a semiconductor layer of predetermined semiconductor thickness on an insulating or insulated substrate so that the junction depth is the predetermined semiconductor thickness and the trenches extend beyond the predetermined semiconductor thickness to the trench depth.

11. An integrated circuit including a semiconductor device according to claim 1.

12. A method of manufacturing a lateral semiconductor device comprising:
   forming a plurality of longitudinally extending trenches filled with insulator having a trench isolation depth to define a plurality of longitudinal active stripes between the longitudinally extending trenches; and
   forming at least one active component including at least one horizontal p-n junction in the longitudinal active stripes, the horizontal p-n junction having a junction depth and a depletion length at breakdown;
   wherein the trench isolation depth is greater than the junction depth; and the width of the active stripes is less than the depletion length at breakdown.

13. A method according to claim 12:
   wherein forming at least one active component includes forming an active pattern defining an active region of the semiconductor body
   using a single shallow trench isolation mask; and
   forming in regions other than the active region a shallow trench isolation structure including in the same step or steps a shallow trench around the active region and the plurality of longitudinally extending trenches within the active region.

14. A method according to claim 12 for forming an insulated gate transistor wherein forming at least one active component includes:
   forming a channel region of first conductivity type between the drain region and the source region; and
   forming a drain region of second conductivity type opposite to the first conductivity type adjacent to the channel region
   forming a source contact region of second conductivity type adjacent to or within the channel region;
   forming an insulated gate over the channel region between the source contact region and the drain region.

15. A method according to claim 12 for forming a diode wherein forming at least one active component includes:
- forming a p-type region and an n-type region with a p-n junction between them; and
- forming contacts to the p-type and n-type regions.

16. A method according to claim 12 further including:
- doping at least one part of the longitudinal active stripes using a shallow doping step to implant dopants to define the depth of the p-n junction.

17. A method according claim 12 further including defining the longitudinally extending active stripes to be tapered.

18. A method according to claim 12 including filling the longitudinally extending trenches with an insulator with a dielectric constant of at least 4.

* * * * *